US009054686B1

United States Patent
Chou

(10) Patent No.: US 9,054,686 B1
(45) Date of Patent: Jun. 9, 2015

(54) DELAY PATH SELECTION FOR DIGITAL CONTROL OSCILLATOR

(71) Applicant: Taiwan Semiconductor Manufacturing Company Limited, Hsin-Chu (TW)

(72) Inventor: Mao-Hsuan Chou, Xinfeng Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/086,115

(22) Filed: Nov. 21, 2013

(51) Int. Cl.
G01R 23/02 (2006.01)
H03D 3/00 (2006.01)
H03K 9/06 (2006.01)
H03K 5/159 (2006.01)

(52) U.S. Cl.
CPC ..................................... *H03K 5/159* (2013.01)

(58) Field of Classification Search
USPC ...................... 327/39–49, 261–264, 269, 270, 327/276–278, 165, 166, 291–299, 374, 178; 327/105–123, 141, 144–163; 326/93–98; 716/6; 331/1 A, 15–1; 375/373–376
See application file for complete search history.

(56) References Cited

U.S. PATENT DOCUMENTS

| | | | | |
|---|---|---|---|---|
| 5,877,641 A | * | 3/1999 | Ziegler et al. | 327/156 |
| 7,688,126 B2 | * | 3/2010 | Henzler et al. | 327/261 |
| 7,932,766 B2 | * | 4/2011 | Choi et al. | 327/276 |
| 8,451,064 B2 | * | 5/2013 | Maheshwari et al. | 331/16 |
| 8,710,883 B1 | * | 4/2014 | Fang et al. | 327/157 |
| 2009/0153214 A1 | * | 6/2009 | Takatori | 327/262 |
| 2012/0086482 A1 | * | 4/2012 | Maheshwari et al. | 327/156 |

* cited by examiner

*Primary Examiner* — Brandon S Cole
(74) *Attorney, Agent, or Firm* — Cooper Legal Group, LLC

(57) ABSTRACT

Among other things, one or more techniques or systems for delay path selection are provided. A digitally controlled oscillator comprises an arrangement of inverters, such as tri-state inverters, that are selectively utilized to provide a process, voltage, temperature (PVT) condition output used to generate a frequency output for the digitally controlled oscillator. Delay path interpolation is used to generate a relatively high resolution range of PVT condition outputs, which results in a reduction of frequency gain (KDOC) between PVT condition outputs for improved performance of the digitally controlled oscillator.

20 Claims, 9 Drawing Sheets

| | A3 | A2 | A1 | A0 | B3 | B2 | B1 | B0 |
|---|---|---|---|---|---|---|---|---|
| Path 1 | 0 | 0 | 0 | 1 | 0 | 0 | 0 | 0 |
| Path 2 | 0 | 0 | 1 | 1 | 0 | 0 | 0 | 1 |
| Path 3 | 0 | 0 | 1 | 0 | 0 | 0 | 0 | 1 |
| Path 4 | 0 | 1 | 1 | 0 | 0 | 0 | 1 | 1 |
| .. | .. | .. | .. | .. | .. | .. | .. | .. |

|        | A3 | A2 | A1 | A0 | B3 | B2 | B1 | B0 |
|--------|----|----|----|----|----|----|----|----|
| Path 1 | 0  | 0  | 0  | 1  | 0  | 0  | 0  | 0  |
| Path 2 | 0  | 0  | 1  | 1  | 0  | 0  | 0  | 1  |
| Path 3 | 0  | 0  | 1  | 0  | 0  | 0  | 0  | 1  |
| Path 4 | 0  | 1  | 1  | 0  | 0  | 0  | 1  | 1  |
| ..     | .. | .. | .. | .. | .. | .. | .. | .. |

US 9,054,686 B1

DELAY PATH SELECTION FOR DIGITAL CONTROL OSCILLATOR

BACKGROUND

A digitally controlled oscillator utilizes digital control codes to output a variable frequency used by digital components, such as a digital phase lock loop component which uses the output of the digitally controlled oscillator to generate a clock signal used by central processing units (CPUs), memory, universal serial bus (USB) devices, serial advanced technology attachment (SATA) devices, or other devices. The digitally controlled oscillator uses inverters and multiplexers for delay path selection to output a process, voltage, temperature (PVT) condition output.

DETAILED DESCRIPTION

Figure 1:
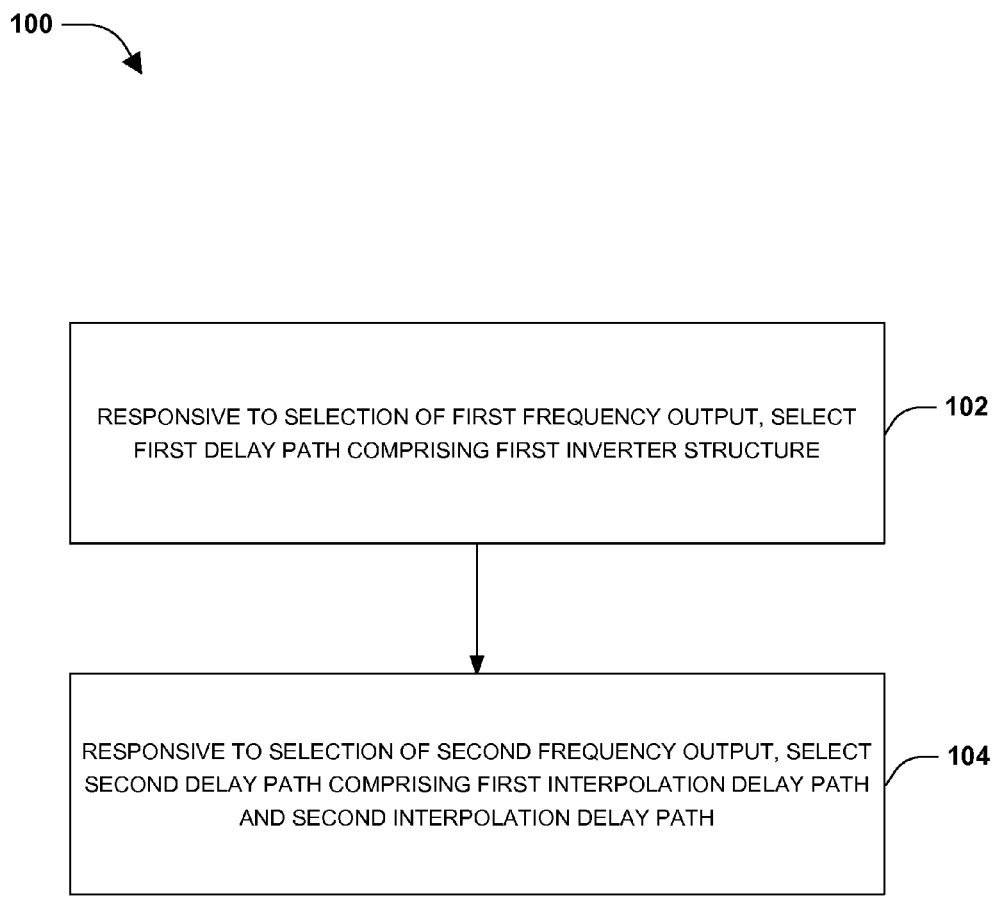
FIG. 1 is a flow diagram illustrating a method of delay path selection, according to some embodiments.
Figure 2:
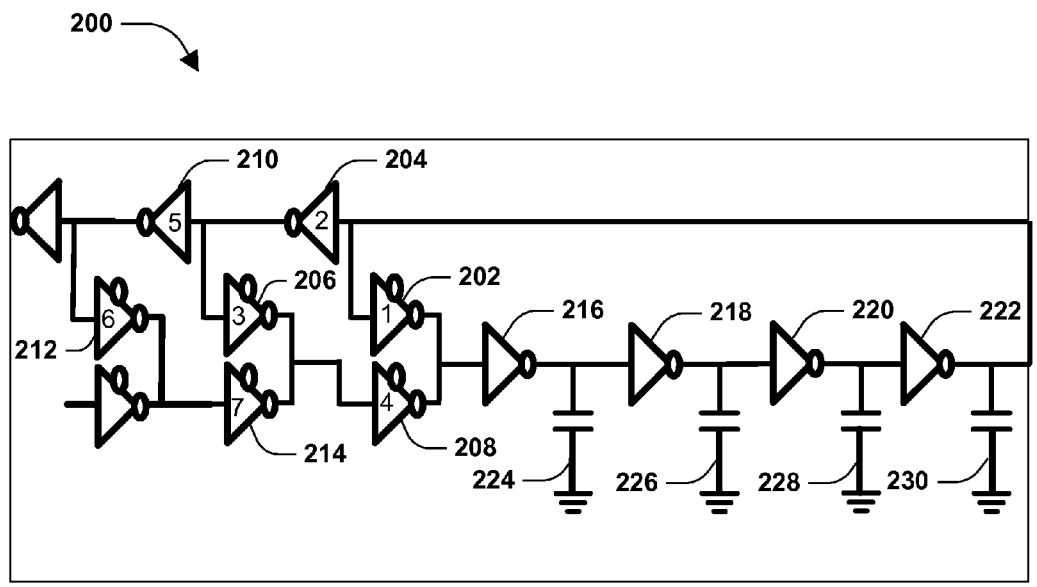
FIG. 2 is an illustration of a digitally controlled oscillator and a set of control codes, according to some embodiments.

Description is now given with reference to the drawings, wherein like reference numerals are generally used to refer to like elements throughout. In the following description, for purposes of explanation, numerous specific details are set. It is evident, however, that the claimed subject matter can be practiced without these specific details. In other instances, structures and devices are illustrated in block diagram form in order to facilitate describing the claimed subject matter.

One or more techniques or systems for delay path selection are provided. An arrangement of one or more inverter structures, such as tri-state inverter structures, is used to create delay paths for a digitally controlled oscillator. The delay paths are selectively utilized to generate a process, voltage, temperature (PVT) condition output. Delay path interpolation is used for at least some of the delays paths, which improves resolution of the digitally controlled oscillator by creating PVT control outputs that would otherwise not be able to be achieved. In some embodiments, delay path interpolation provides for PVT condition outputs in increments of about 250 MHZ, as opposed to merely 500 MHz increments, thus reducing a frequency gain (KDCO) between PVT condition outputs, such as about a 50% reduction in frequency gain (KDCO). The ability to generate such a resolution range of PVT control outputs allows for higher resolution coarse tuning and higher resolution fine tuning of a frequency output for the digitally controlled oscillator.

A method 100 of delay path selection is illustrated in FIG. 1, and one or more systems for delay path selection are illustrated in FIGS. 2-6. A digitally controlled oscillator 200 comprises an arrangement of inverter structures used to create one or more delay paths that generate PVT condition outputs. In some embodiments, the arrangement of inverter structures comprises a first inverter structure 202, a second inverter structure 204, a third inverter structure 206, a fourth inverter structure 208, a fifth inverter structure 210, a sixth inverter structure 212, and a seventh inverter structure 214. In some embodiments, an inverter structure comprises a tri-state inverter structure. Delay paths are selectively used to output various increments of PVT condition outputs, such as in increments of about 250 MHz. Delay paths are selected based upon a set of control codes 232. The digitally controlled oscillator 200 comprises a coarse tuning arrangement of inverter structures, such as a first coarse adjustment inverter structure 216, a second coarse adjustment inverter structure 218, a third coarse adjustment inverter structure 220, and a fourth coarse adjustment inverter structure 222. The coarse tuning arrangement of inverter structures are selectively used for coarse tuning adjustment of PVT condition outputs, such as in increments of about 50 MHz, to generate coarse outputs. The digitally controlled oscillator 200 comprises a fine tuning arrangement of capacitors, such as a first capacitor 224, a second capacitor 226, a third capacitor 228, and a fourth capacitor 230. The fine tuning arrangement of capacitors are selectively used for fine tuning adjustment of coarse outputs from the coarse tuning arrangement of inverter structures, such as in increments of about 1 MHz, to generate a frequency output for the digitally controlled oscillator 200. Accordingly, delay path selection for the arrangement of inverter structures, such as delay path interpolation, is performed to generate a relatively higher resolution range of PVT condition outputs, such as in increments of about 250 MHz as opposed to 500 MHz increments.

Figure 3:
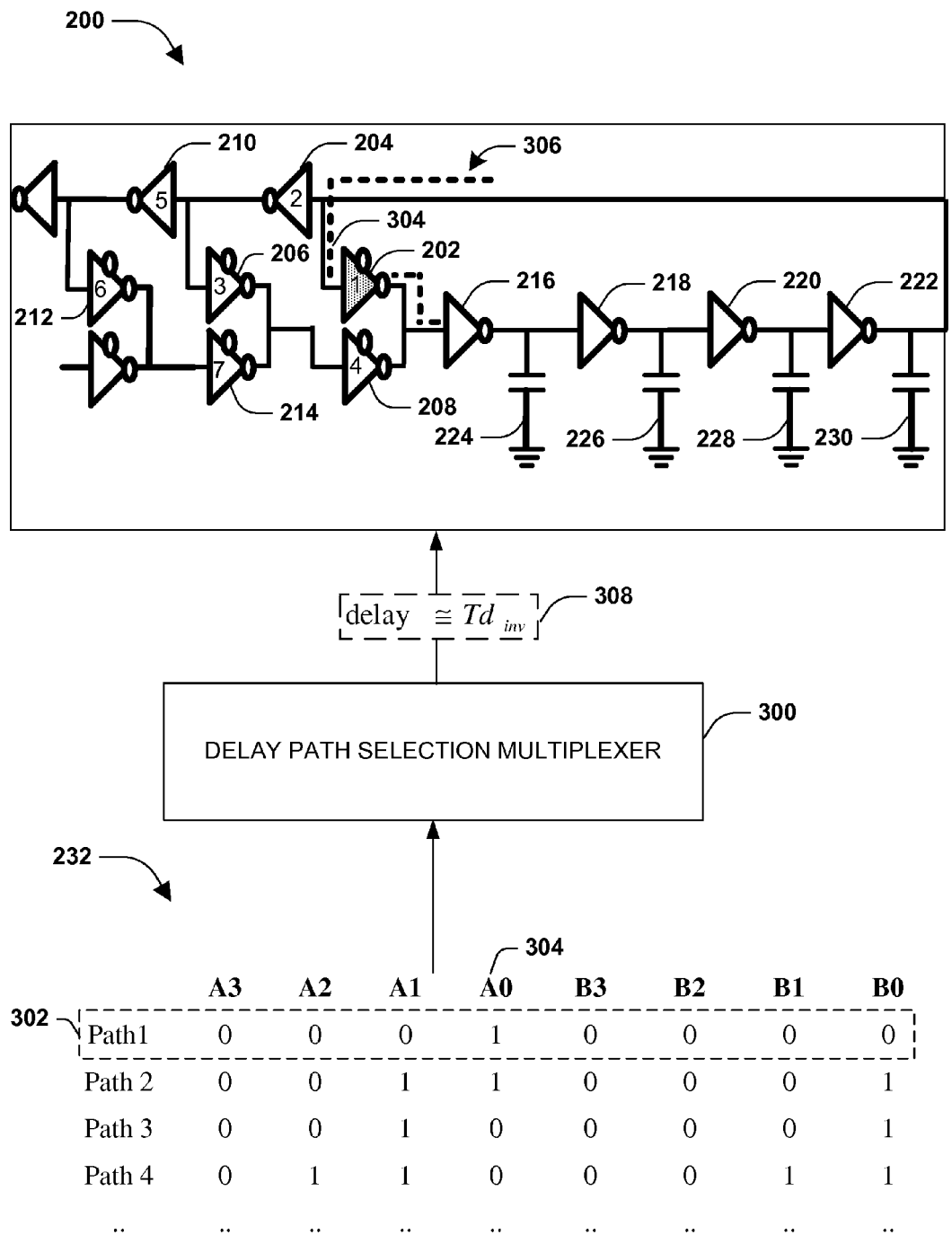
FIG. 3 is an illustration of selecting a first delay path, according to some embodiments.

At 102, responsive to selection of a first frequency output, a first delay path 306 comprising the first inverter structure 202 is selected, as illustrated in FIG. 3. In some embodiments, a delay path selection multiplexer 300 utilizes a first path code 302 to select the first delay path 306 by enabling a node (A0) 304 so that the first delay path 306 comprises the first inverter structure 202. The first delay path 306 has a first delay 308 corresponding to a single inverter delay provided by the first inverter structure 202, such as a delay of about 1 $Td_{inv}$.

Figure 4:
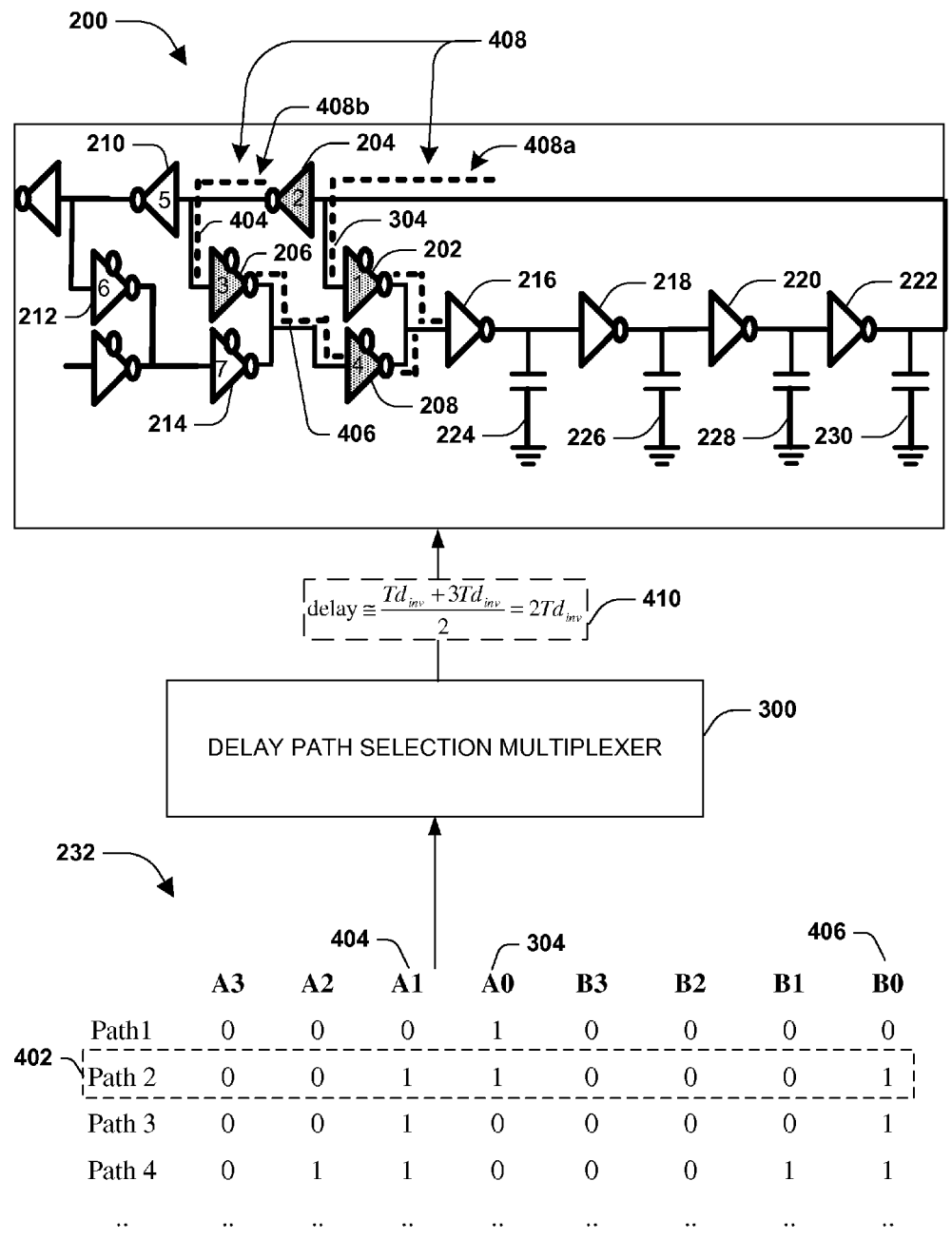
FIG. 4 is an illustration of selecting a second delay path, according to some embodiments.

At 202, responsive to selection of a second frequency output, a second delay path 408 comprising a first interpolation delay path 408a and a second interpolation delay path 408b is selected, as illustrated in FIG. 4. The first interpolation delay path 408a comprises the first inverter structure 202. The second interpolation delay path 408b comprises the second inverter structure 204, the third inverter structure 206, and the fourth inverter structure 208. In some embodiments, the delay path selection multiplexer 300 utilizes a second path code 402 to select the first interpolation delay path 408a by enabling the node (A0) 304 so that the first interpolation delay path 408a comprises the first inverter structure 202. The delay path selection multiplexer 300 utilizes the second path code 402 to select the second interpolation delay path 408b by enabling a node (A1) 404 and a node (B0) 406 so that the second interpolation delay path 408b comprises the second inverter structure 204, the third inverter structure 206, and the fourth inverter structure 208.

Delay path interpolation is performed upon the first interpolation delay path 408a and the second interpolation delay path 408b to provide a second delay 410 for the second delay path 408. The second delay 410 corresponds to an average of a first interpolation path delay of the first interpolation delay path 408a, such as a delay of about 1 $Td_{inv}$ corresponding to the first inverter structure 202, and a second interpolation path delay of the second interpolation delay path 408b, such as a delay of about 3 $Td_{inv}$ corresponding to the second inverter structure 204, the third inverter structure 206, and the fourth inverter structure 208. In this way, the second delay 410 is a two inverter delay of about 2 $Td_{inv}$ based upon an average of the 1 $Td_{inv}$ and the 3 $Td_{inv}$. A relatively fine grained resolution for frequency output is achieved based upon the first delay path 306 having a single inverter delay of 1 $Td_{inv}$ and the second delay path 408 having a two inverter delay of 2 $Td_{inv}$, which provides a relatively smaller frequency gain (KDCO) between the first delay path 306 and the second delay path 408 that corresponds to about 1 $Td_{inv}$, as opposed to frequency gain corresponding to 2 $Td_{inv}$ where delay path interpolation is not utilized and the second delay path 402 is not achievable.

Figure 5:
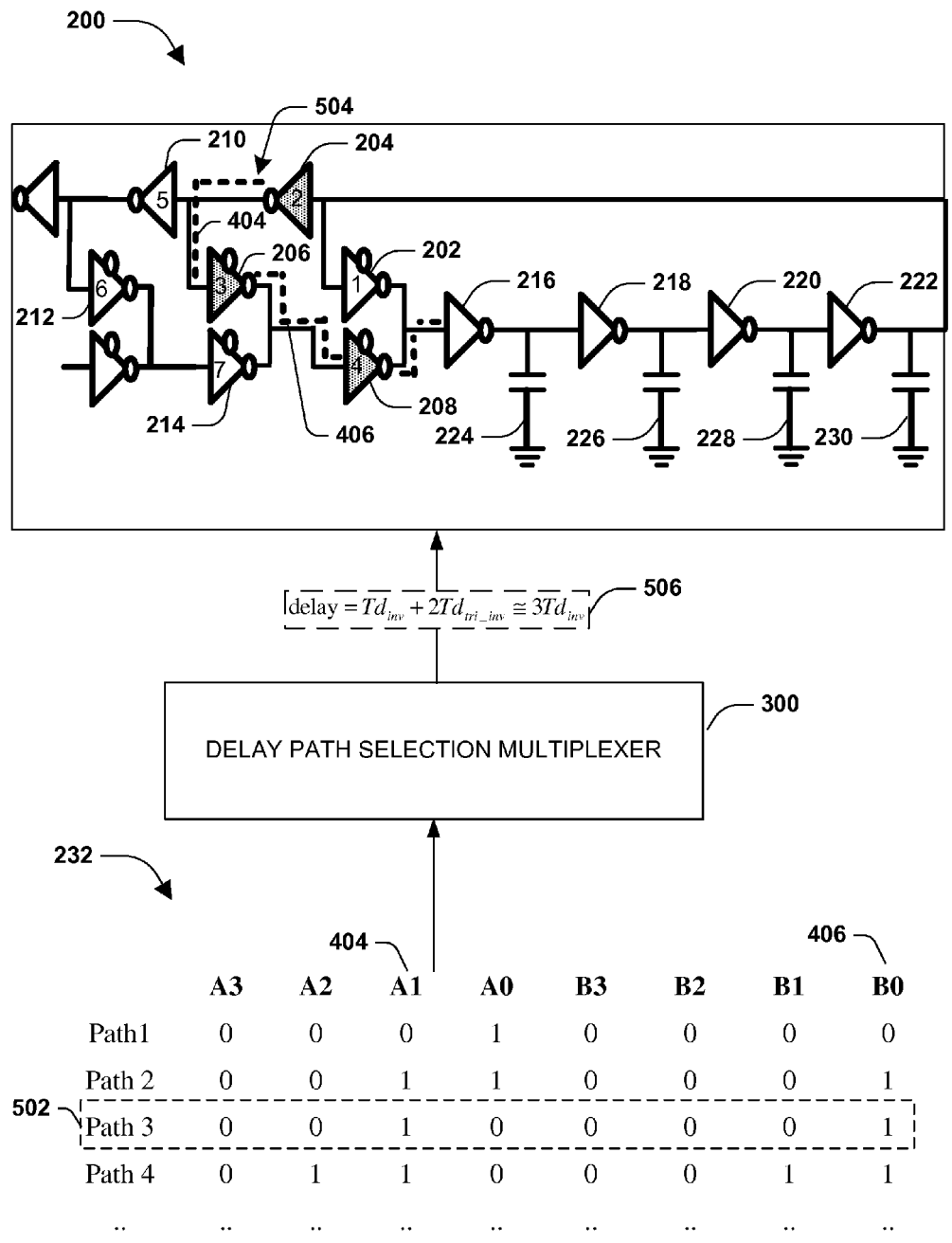
FIG. 5 is an illustration of selecting a third delay path, according to some embodiments.

Responsive to selection of a third frequency output, a third delay path 504 comprising the second inverter structure 204, the third inverter structure 206, and the fourth inverter structure 208 is selected, as illustrated in FIG. 5. In some embodiments, the delay path selection multiplexer 300 utilizes a third path code 502 to select the third delay path 504 by enabling the node (A1) 404 and the node (B0) 406 so that the third delay path 504 comprises the second inverter structure 204, the third inverter structure 206, and the fourth inverter structure 208. The third delay path 504 has a third delay 506 corresponding to a three inverter delay provided by the second inverter structure 204, the third inverter structure 206, and the fourth inverter structure 208, such as a delay of about 3 $Td_{inv}$. A relatively fine grained resolution for frequency output is achieved based upon the second delay path 408 having the two inverter delay of about 2 $Td_{inv}$, and the third delay path 504 having the three inverter delay of about 3 $Td_{inv}$, which provides a relatively smaller frequency gain between the second delay path 408 and the third delay path 504, such as a frequency gain corresponding to about 1 $Td_{inv}$, as opposed to a frequency gain corresponding to about 2 $Td_{inv}$ between the first delay path 306 and the third delay path 504 where delay path interpolation is not utilized and the second delay path 402 is not achievable. In this way, a first frequency gain of about 1 $Td_{inv}$ between the first delay path 304 and the second delay path 408, where delay path interpolation is used to achieve the second delay path 408, is relatively smaller than a second frequency gain of about 2 $Td_{inv}$ between the first delay path 304 and the third delay path 504 where delay path interpolation is not used and thus the second delay path 408 is not achievable.

Figure 6:
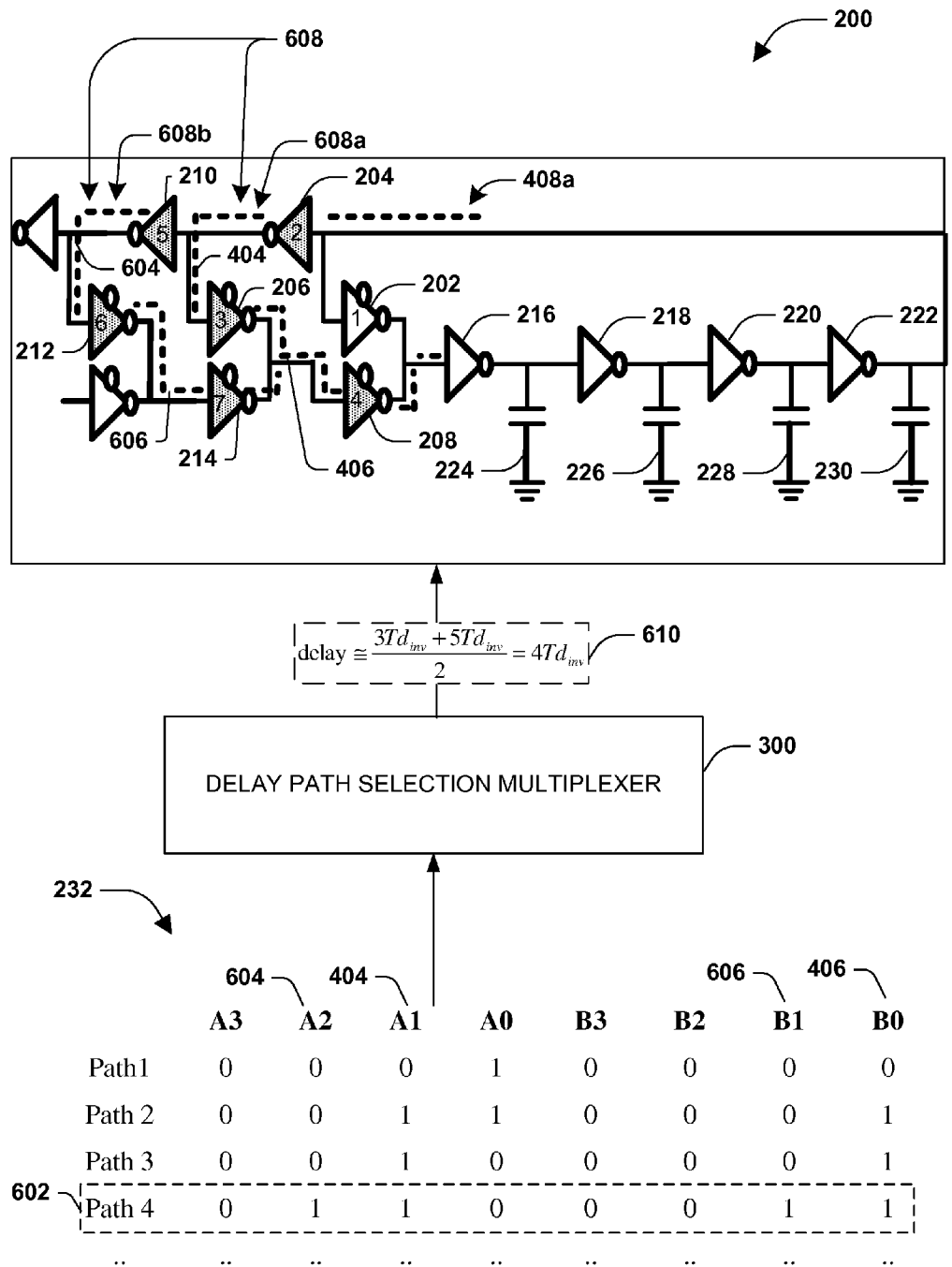
FIG. 6 is an illustration of selecting a fourth delay path, according to some embodiments.

Responsive to selection of a fourth frequency output, a fourth delay path 608 comprising a third interpolation delay path 608a and a fourth interpolation delay path 608b is selected, as illustrated in FIG. 6. The third interpolation delay path 608a comprises the second inverter structure 204, the third inverter structure 206, and the fourth inverter structure 208. The fourth interpolation delay path 608b comprises the second inverter structure 204, the fifth inverter structure 210, the sixth inverter structure 212, the seventh inverter structure 214, and the fourth inverter structure 208. In some embodiments, the delay path selection multiplexer 300 utilizes a fourth path code 602 to select the third interpolation delay path 608a by enabling the node (A1) 404 and the node (B0) 406 so that the third interpolation delay path 608a comprises the second inverter structure 204, the third inverter structure 206, and the fourth inverter structure 208. The delay path selection multiplexer 300 utilizes the fourth path code 602 to select the fourth interpolation delay path 608b by enabling a node (A2) 604, the node (B0) 406, and a node (B1) 606 so that the fourth interpolation delay path 608b comprises the second inverter structure 204, the fifth inverter structure 210, the sixth inverter structure 212, the seventh inverter structure 214, and the fourth inverter structure 208.

Delay path interpolation is performed upon the third interpolation delay path 608a and the fourth interpolation delay path 608b to provide a fourth delay 610 for the fourth delay path 608. The fourth delay 610 corresponds to an average of a third interpolation path delay of the third interpolation delay path 608a, such as a delay of about 3 $Td_{inv}$ corresponding to the second inverter structure 204, the third inverter structure 206, and the fourth inverter structure 208, and a fourth interpolation path delay of the fourth interpolation delay path 608b, such as a delay of about 5 $Td_{inv}$ corresponding to the second inverter structure 204, the fifth inverter structure 210, the sixth inverter structure 212, the seventh inverter structure 214, and the fourth inverter structure 208. In this way, the fourth delay 610 is a four inverter delay of about 4 $Td_{inv}$ based upon an average of the 3 $Td_{inv}$ and the 5 $Td_{inv}$. A relatively fine grained resolution for frequency output is achieved based upon the first delay path 306 having a single inverter delay of about 1 $Td_{inv}$, the second delay path 408 having a two inverter delay of about 2 $Td_{inv}$, the third delay path 504 having a three inverter delay of about 3 $Td_{inv}$, and the fourth delay path 608 having a four inverter delay of about 4 $Td_{inv}$. The ability to generate delays paths in increments of about 1 $Td_{inv}$, as opposed to about 2 $Td_{inv}$, provides a relatively smaller frequency gain between delay paths resulting in the relatively fine grained resolution for PVT condition outputs. Increase resolution for selecting PVT condition outputs results in improved performance for the digitally controlled oscillator 200.

Figure 7:
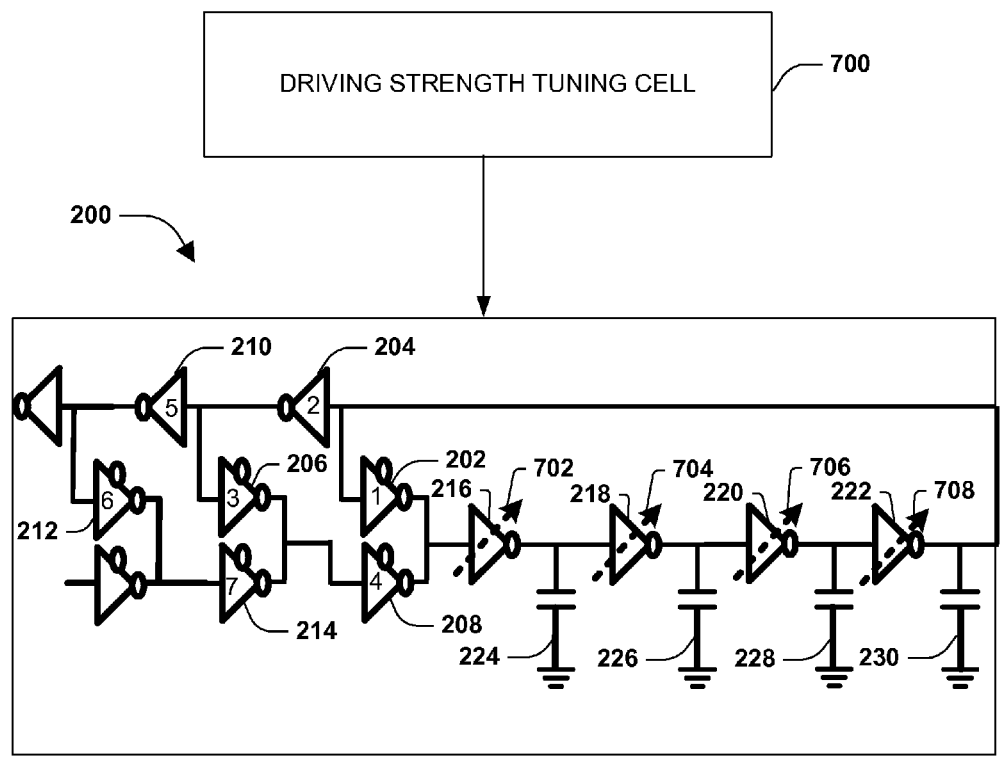
FIG. 7 is an illustration of a driving strength tuning cell, according to some embodiments.

FIG. 7 illustrates a driving strength tuning cell 700 for the digitally controlled oscillator 200. The driving strength tuning cell 700 is configured for coarse tuning of a PVT condition output from the inverter arrangement. The driving strength tuning cell 700 selectively utilizes one or more coarse adjustment inverter structures, such as utilization 702 of the first coarse adjustment inverter structure 216, utilization 704 of the second coarse adjustment inverter structure 218, utilization 706 of the third coarse adjustment inverter structure 220, and utilization 708 of the fourth coarse adjustment inverter structure 222, for tuning the PVT condition output, such as in increments of about 50 MHz, to generate coarse outputs.

Figure 8:
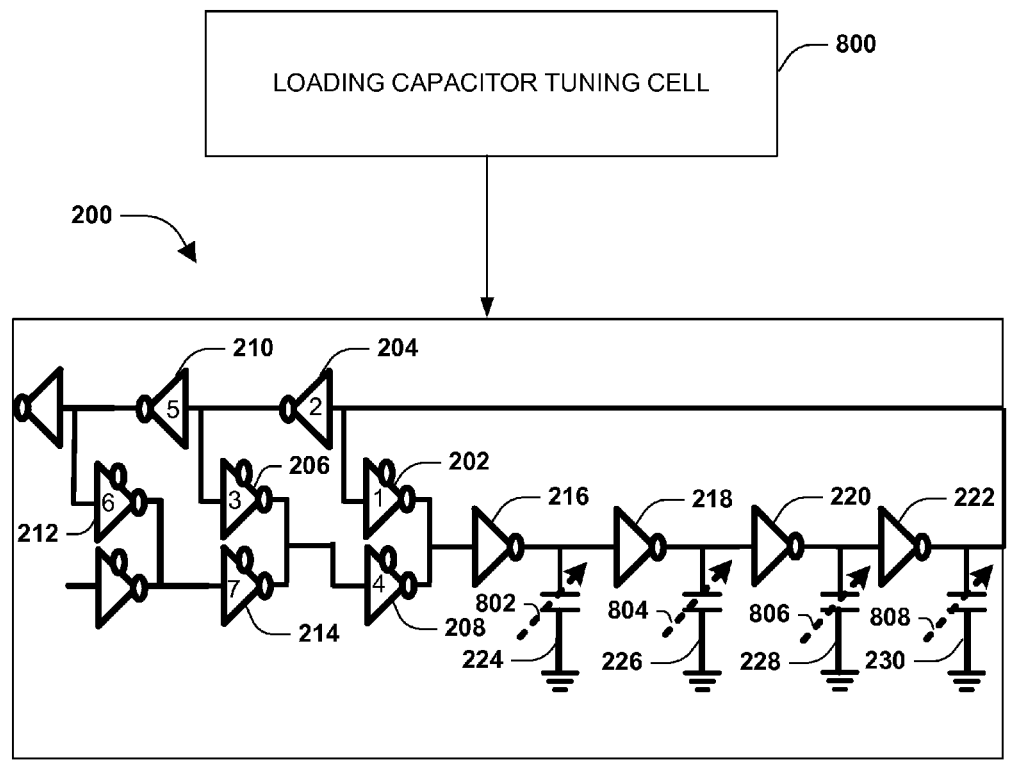
FIG. 8 is an illustration of a loading capacitor tuning cell, according to some embodiments.

FIG. 8 illustrates a loading capacitor tuning cell 800 for the digitally controlled oscillator 200. The loading capacitor tuning cell 800 is configured for fine tuning of coarse outputs from the driving strength tuning cell 700. The loading capacitor tuning cell 800 selectively utilizes one or more capacitors, such as utilization 802 of the first capacitor 224, utilization 804 of the second capacitor 226, utilization 806 of the third capacitor 228, and utilization 808 of the fourth capacitor 230, for tuning the coarse outputs, such as in increments of about 1 MHz, to generate a frequency output for the digitally controlled oscillator 200.

Figure 9:
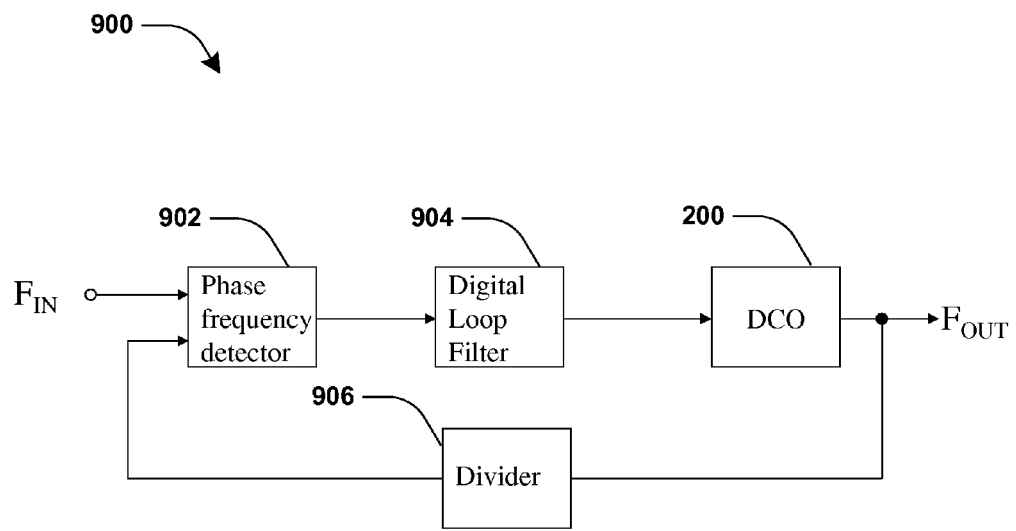
FIG. 9 is an illustration of a phase lock loop device, according to some embodiments.

FIG. 9 illustrates a phase lock loop device 900. The phase lock loop device 900 comprises a phase frequency detector 902 that receives a frequency input (Fin) and a divider output from a divider 906. The phase lock loop device 902 comprises a digital loop filter 904 that digitally filters an output of the phase frequency detector 902. An output from the digital loop filter 904 is provided to the digitally controlled oscillator 200. The digitally controlled oscillator 200 performs delay path selection, such as delay path interpolation on an arrangement of inverters, to produce a relatively high resolution range of PVT condition outputs, such as in increments of about 250 MHz. The driving strength tuning cell 702 of the digitally controlled oscillator 200 performs coarse tuning of the PVT condition outputs, such as in increments of about 50 MHz, to generate coarse outputs. The loading capacitor tuning cell 802 performs fine tuning of the coarse outputs, such as in increments of about 1 MHz, to generate a frequency output (Fout) for the digitally controlled oscillator 200.

According to an aspect of the instant disclosure, a system for delay path selection is provided. The system comprises a digitally controlled oscillator. The digitally controlled oscillator comprises a first delay path. The first delay path comprises a first inverter structure. The digital oscillator comprises a second delay path. The second delay path comprises a first interpolation delay path and a second interpolation delay path. The first interpolation delay path comprises the first inverter structure. The second interpolation delay path comprises a second inverter structure, a third inverter structure, and a fourth inverter structure.

According to an aspect of the instant disclosure, a system for delay path selection is provided. The system comprises a digitally controlled oscillator. The digitally controlled oscillator comprises a first delay path. The first delay path comprises a first inverter structure. The digital oscillator comprises a second delay path. The second delay path comprises a first interpolation delay path and a second interpolation delay path. The digitally controlled oscillator comprises a delay path selection multiplexer. The delay path selection multiplexer is configured to select the first delay path for a first frequency output corresponding to the first inverter structure. The delay path selection multiplexer is configured to select the second delay path for a second frequency output corresponding to an interpolation between the first interpolation delay path and the second interpolation delay path.

According to an aspect of the instant disclosure, a method for delay path selection is provided. The method comprises selecting a first delay path comprising a first inverter structure in response to a selection of a first frequency output. In response to a selection of a second frequency output, a second delay path comprising a first interpolation delay path and a second interpolation delay path is selected. The first interpolation delay path comprises the first inverter structure. The second interpolation delay path comprises a second inverter structure, a third inverter structure, and a fourth inverter structure.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system for delay path selection, comprising:
   a delay path selection multiplexer; and a digitally controlled oscillator comprising: a first inverter structure configured to be selectively enabled by the delay path selection multiplexer to establish a first delay path within the digitally controlled oscillator; and a second inverter structure configured to be selectively enabled by the delay path selection multiplexer to establish a second delay path within the digitally controlled oscillator, the second delay path and the first delay path having at least one inverter structure in common, and wherein: the delay path selection multiplexer is configured to selectively enable the first inverter structure and the second inverter structure based upon a selected frequency output of the digitally controlled oscillator.

2. The system of claim 1, the digitally controlled oscillator comprising:
   a third inverter structure configured to be selectively enabled by the delay path selection multiplexer to establish a third delay path within the digitally controlled oscillator.

3. The system of claim 2, a first frequency gain between the first delay path and the second delay path smaller than a second frequency gain between the first delay path and the third delay path.

4. The system of claim 2, the third delay path having at least one inverter structure in common with at least one of the first delay path or the second delay path.

5. The system of claim 1, the digitally controlled oscillator configured to:
perform delay path interpolation upon the first interpolation delay path and the second interpolation delay path when the first inverter structure and the second inverter structure are enabled concurrently.

6. The system of claim 1, at least one of the first inverter structure or the second inverter structure comprising a tri-state inverter.

7. The system of claim 1, wherein the delay path selection multiplexer enables the first delay path responsive to a first frequency output being selected and enables the second delay path responsive to a second frequency output being selected.

8. The system of claim 7, the first frequency output corresponding to a first process, voltage, temperature (PVT) condition and the second frequency output corresponding to a second process voltage temperature (PVT) condition.

9. The system of claim 1, the digitally controlled oscillator comprising:
a driving strength tuning cell for coarse tuning of a process, voltage, temperature (PVT) condition output from at least one of the first delay path or the second delay path.

10. The system of claim 9, the digitally controlled oscillator comprising:
a loading capacitor tuning cell for fine tuning of a coarse output from the driving strength tuning cell to create a frequency output for the digitally controlled oscillator.

11. A system for delay path selection, comprising:
a delay path selection multiplexer; and
a digitally controlled oscillator comprising:
 a first inverter structure configured to be selectively enabled by the delay path selection multiplexer to establish a first delay path within the digitally controlled oscillator; and
 a second inverter structure configured to be selectively enabled by the delay path selection multiplexer to establish a second delay path within the digitally controlled oscillator,
wherein the delay path selection multiplexer is configured to selectively enable the first inverter structure and the second inverter structure based upon a selected frequency output of the digitally controlled oscillator.

12. The system of claim 11, at least one of the first inverter structure or the second inverter structure comprising a tri-state inverter.

13. The system of claim 11, the first delay path and the second delay path merging at a node.

14. The system of claim 11, the digitally controlled oscillator comprising:
a third inverter structure configured to be selectively enabled by the delay path selection multiplexer to establish a third delay path within the digitally controlled oscillator.

15. The system of claim 13, comprising:
a third inverter structure coupled to the node; and
a capacitor coupled to the third inverter structure, the third inverter structure disposed between the node and the capacitor.

16. The system of claim 11, the first delay path and the second delay path having a common input node and a common output node.

17. A method for delay path selection, comprising: receiving a selection of a frequency output for a digitally controlled oscillator; responsive to the selection corresponding to a first frequency output, enabling a first inverter structure to establish a first delay path within the digitally controlled oscillator; and responsive to the selection corresponding to a second frequency output, enabling a second inverter structure to establish a second delay path within the digitally controlled oscillator, the second delay path different than the first delay path.

18. The method of claim 17, comprising: responsive to the selection corresponding to a third frequency output, enabling a third inverter structure to establish a third delay path within the digitally controlled oscillator.

19. The method of claim 18, a first frequency gain between the first delay path and the second delay path smaller than a second frequency gain between the first delay path and the third delay path.

20. The method of claim 17, the second inverter structure not enabled responsive to the selection corresponding to the first frequency output.

* * * * *